(12) United States Patent
Shin

(10) Patent No.: US 10,763,834 B2
(45) Date of Patent: Sep. 1, 2020

(54) LATCH CIRCUIT

(71) Applicant: SAMSUNG ELECTRONICS CO., LTD., Suwon-si, Gyeonggi-Do (KR)

(72) Inventor: Ho Young Shin, Gunpo-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/407,757

(22) Filed: May 9, 2019

(65) Prior Publication Data

US 2020/0119723 A1   Apr. 16, 2020

(30) Foreign Application Priority Data

Oct. 10, 2018   (KR) .................. 10-2018-0120420

(51) Int. Cl.
| | |
|---|---|
| *H01L 27/11* | (2006.01) |
| *H03K 3/037* | (2006.01) |
| *H03K 19/0185* | (2006.01) |
| *G11C 16/04* | (2006.01) |
| *G11C 16/08* | (2006.01) |
| *G11C 16/30* | (2006.01) |
| *G11C 16/14* | (2006.01) |
| *G11C 16/10* | (2006.01) |

(52) U.S. Cl.
CPC ..... *H03K 3/037* (2013.01); *H03K 19/018521* (2013.01); *G11C 16/0483* (2013.01); *G11C 16/08* (2013.01); *G11C 16/10* (2013.01); *G11C 16/14* (2013.01); *G11C 16/30* (2013.01)

(58) Field of Classification Search
CPC ............ H01L 27/0207; H01L 27/1104; H01L 2924/0002; H01L 2924/00; G11C 11/412
See application file for complete search history.

(56) References Cited

U.S. PATENT DOCUMENTS

| | | |
|---|---|---|
| 5,973,963 A | 10/1999 | Sugawara |
| 7,180,329 B1 | 2/2007 | Sia et al. |
| 7,268,588 B2 | 9/2007 | Sanchez et al. |
| 7,696,806 B2 | 4/2010 | Chu et al. |

(Continued)

FOREIGN PATENT DOCUMENTS

| | | |
|---|---|---|
| KR | 10-2014-0006189 | 1/2014 |
| KR | 10-1753251 | 7/2017 |

*Primary Examiner* — Sibin Chen
(74) *Attorney, Agent, or Firm* — F. Chau & Associates, LLC

(57) ABSTRACT

A latch circuit including: a first inverter having a first pull-up transistor connected between a first power supply node and a first output node, and a first pull-down transistor connected between a second power supply node and the first output node; a second inverter having a second pull-up transistor connected between the first power supply node and a second output node, and a second pull-down transistor connected between the second power supply node and the second output node; a first current control transistor connected between the first pull-up transistor and the first output node; a second current control transistor connected between the second pull-up transistor and the second output node; a third current control transistor connected between the first pull-down transistor and the first output node; and a fourth current control transistor connected between the second pull-down transistor and the second output node.

20 Claims, 11 Drawing Sheets

(56) References Cited

U.S. PATENT DOCUMENTS

| | | |
|---|---|---|
| 7,795,945 B2 | 9/2010 | Shimizu et al. |
| 8,836,406 B2 | 9/2014 | Wang |
| 8,842,464 B2 | 9/2014 | Jung et al. |
| 9,608,615 B2 | 3/2017 | Moscaluk et al. |
| 2002/0117713 A1* | 8/2002 | Kitamura ........ H01L 21/823814 257/336 |
| 2007/0279999 A1 | 12/2007 | Watanabe et al. |
| 2015/0229307 A1 | 8/2015 | Badrudduza et al. |
| 2019/0181843 A1* | 6/2019 | Paul ....................... H03K 3/012 |

* cited by examiner

I-I'

LATCH CIRCUIT

CROSS-REFERENCE TO RELATED APPLICATION

This application claims priority under 35 U.S.C. § 119 to Korean Patent Application No. 10-2018-0120420, filed on Oct. 10, 2018, in the Korean Intellectual Property Office, the disclosure of which is incorporated by reference herein in its entirety.

TECHNICAL FIELD

The present inventive concept relates to a latch circuit.

DESCRIPTION OF RELATED ART

Processes to manufacture semiconductor elements are becoming finer and the magnitudes of power supply voltages are decreasing. However, the magnitude of the voltage required to drive a memory device, and the like, may not be reduced, regardless of the magnitude of the power supply voltage. Therefore, a latch circuit may be used to generate an operating voltage necessary for driving the memory device, or the like, using a low power supply voltage. The latch circuit may generate a high output voltage using a relatively low input voltage. However, when a magnitude of the input voltage is reduced, the latch circuit may not operate smoothly.

SUMMARY

A latch circuit according to an exemplary embodiment of the present inventive concept includes a first inverter having a first pull-up transistor connected between a first power supply node for supplying a first power supply voltage and a first output node, and a first pull-down transistor connected between a second power supply node for supplying a second power supply voltage and the first output node, wherein the second power supply voltage is lower than the first power supply voltage; a second inverter having a second pull-up transistor connected between the first power supply node and a second output node, and a second pull-down transistor connected between the second power supply node and the second output node; a first current control transistor connected between the first pull-up transistor and the first output node; a second current control transistor connected between the second pull-up transistor and the second output node; a third current control transistor connected between the first pull-down transistor and the first output node; and a fourth current control transistor connected between the second pull-down transistor and the second output node.

A latch circuit according to an exemplary embodiment of the present inventive concept includes a first transistor for transferring a first input voltage; a second transistor for transferring a second input voltage having a phase opposite to the first input voltage; a first inverter for outputting a first output voltage having the same phase as the first input voltage in response to the second input voltage, and having a pair of pull-up transistors connected to each other in series and a first pull-down transistor; and a second inverter for outputting a second output voltage having the same phase as the second input voltage in response to the first input voltage, and having a pair of pull-up transistors connected to each other in series and a second pull-down transistor.

A latch circuit according to an exemplary embodiment of the present inventive concept includes a first inverter for outputting a first output voltage having the same phase as a first input voltage in response to a second input voltage having a phase opposite to the first input voltage, and including a pair of pull-up transistors connected to each other in series and a pair of pull-down transistors connected to each other in series; and a second inverter for outputting a second output voltage having the same phase as the second input voltage in response to the first input voltage, and including a pair of pull-up transistors connected to each other in series and a pair of pull-down transistors connected to each other in series, wherein the pull-down transistors included in each of the first inverter and the second inverter have a triple-well structure.

BRIEF DESCRIPTION OF DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Hereinafter, exemplary embodiments of the present inventive concept will be described with reference to the accompanying drawings.

Figure 1:
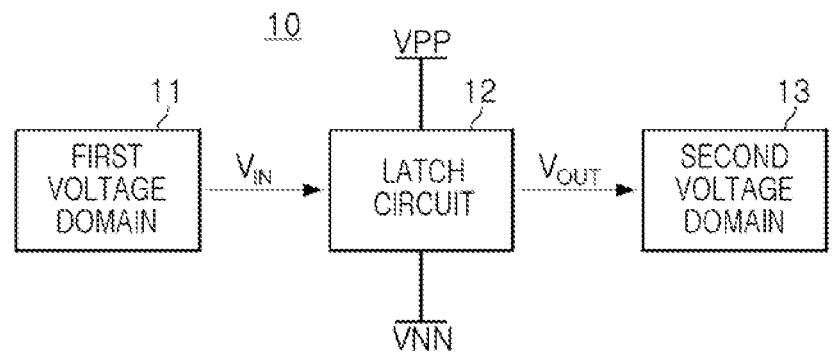
FIG. 1 is a schematic block diagram illustrating a system including a latch circuit according to an exemplary embodiment of the present inventive concept.

FIG. 1 is a schematic block diagram illustrating a system including a latch circuit according to an exemplary embodiment of the present inventive concept.

Referring to FIG. 1, a system 10 according to an exemplary embodiment of the present inventive concept may include a first voltage domain 11, a second voltage domain 13, and a latch circuit 12. Each of the first voltage domain 11 and the second voltage domain 13 may include a plurality of circuits. For example, circuits included in the first voltage domain 11 may be operated by an input voltage $V_{IN}$ and circuits included in the second voltage domain 13 may be operated by an output voltage $V_{OUT}$. Each of the input voltage $V_{IN}$ and the output voltage $V_{OUT}$ may swing to have a voltage difference of different magnitudes.

The latch circuit 12 may be connected between the first voltage domain 11 and the second voltage domain 13 and may generate the output voltage $V_{OUT}$ by using the input voltage $V_{IN}$. The latch circuit 12 may further receive power supply voltages VPP and VNN for generating the output voltage $V_{OUT}$ in addition to the input voltage $V_{IN}$.

The latch circuit 12 may include an inverter connected between power supply nodes supplying the power supply voltages VPP and VNN, and the inverter may be operated by the input voltage $V_{IN}$. Therefore, when the magnitude of the input voltage $V_{IN}$ with respect to the output voltage $V_{OUT}$ decreases, the inverter may not operate properly to determine the swing width of the output voltage $V_{OUT}$. As a result, the latch circuit 12 may not operate stably.

In exemplary embodiments of the present inventive concept, a current control transistor for controlling current flowing to an output node outputting the output voltage $V_{OUT}$ may be included in the latch circuit 12. The current control transistor may be controlled by the input voltage $V_{IN}$ and may be turned on or off when the output voltage $V_{OUT}$ increases or decreases to adjust the current flowing to the output node. Therefore, the latch circuit 12 may operate stably even with a low input voltage $V_{IN}$.

FIGS. 2A, 2B, 3 and 4 are diagrams illustrating an operation of a latch circuit according to an exemplary embodiment of the present inventive concept.

Figure 2A:
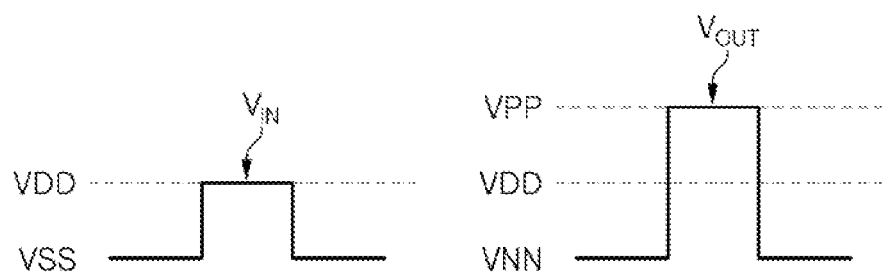
FIGS. 2A, 2B, 3 and 4 are diagrams illustrating an operation of a latch circuit according to an exemplary embodiment of the present inventive concept.
Figure 2B:
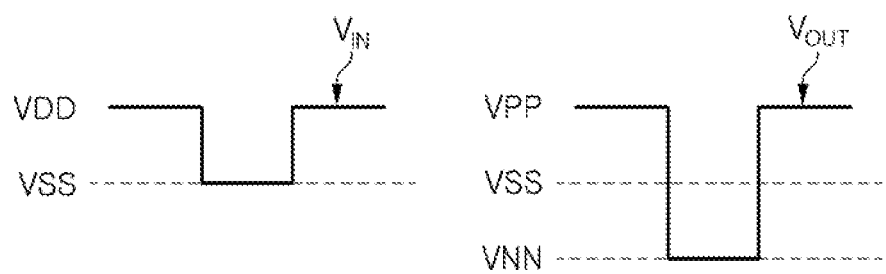
Figure 3:
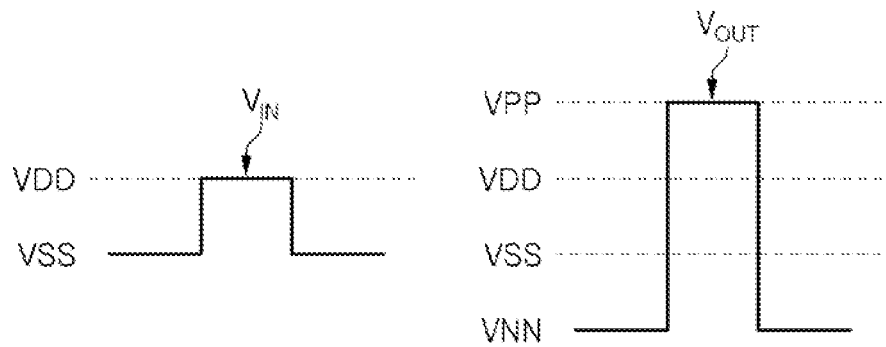

First, FIGS. 2A, 2B and 3 are diagrams illustrating an input voltage $V_{IN}$ and an output voltage $V_{OUT}$ of a latch circuit. FIGS. 2A and 2B illustrate an operation of a half latch circuit increasing or decreasing the input voltage $V_{IN}$. Referring first to FIG. 2A, the input voltage $V_{IN}$ may swing in a form of a square wave between a first input level VDD and a second input level VSS. The latch circuit may increase the input voltage $V_{IN}$ to produce the output voltage $V_{OUT}$. The output voltage $V_{OUT}$ may swing in a square wave form between a first power supply voltage VPP and a second power supply voltage VNN and may have the same phase as the input voltage $V_{IN}$. In an exemplary embodiment of the present inventive concept illustrated in FIG. 2A, the second power supply voltage VNN may have the same magnitude as the second input level VSS. In addition, the first power supply voltage VPP may be higher than the first input level VDD.

Referring to FIG. 2B, the latch circuit may reduce the input voltage $V_{IN}$ to generate the output voltage $V_{OUT}$. The output voltage $V_{OUT}$ may swing in a form of a square wave between the first power supply voltage VPP and the second power supply voltage VNN and the first power supply voltage VPP may have the same magnitude as the first input level VDD. In addition, the second power supply voltage VNN may be lower than the second input level VSS. For example, the second power supply voltage VNN may be a negative voltage.

Next, FIG. 3 is a diagram illustrating an operation of a full latch circuit increasing a swing width of an input voltage $V_{IN}$ in positive and negative directions to generate an output voltage $V_{OUT}$. In an exemplary embodiment of the present inventive concept illustrated in FIG. 3, a latch circuit may generate the output voltage $V_{OUT}$ swinging in the form of a square wave between a first power supply voltage VPP and a second power supply voltage VNN. As illustrated in FIG. 3, the first power supply voltage VPP may be higher than the first input level VDD and the second power supply voltage VNN may be less than the second input level VSS.

Figure 4:
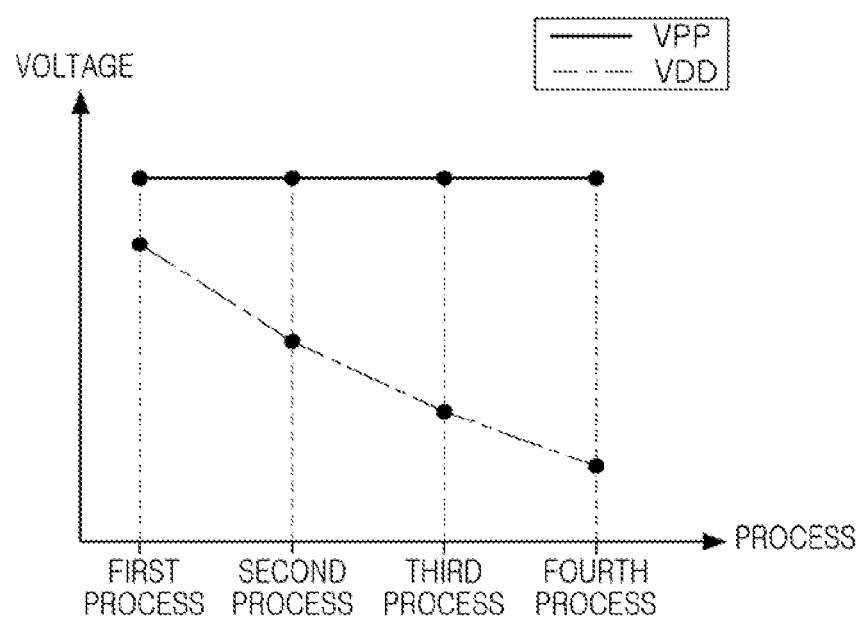

FIG. 4 is a graph illustrating a difference in levels between the input voltage to which the latch circuit is input and the output voltage to be output by the latch circuit. In an exemplary embodiment of the present inventive concept illustrated in FIG. 4, a process may become finer as the process is changed from a first process to a fourth process, thereby reducing an operating voltage of the transistors formed in a microprocessing. For example, the operating voltage VDD required for the transistors formed in a logic area to operate may gradually decrease as the process becomes finer.

The latch circuit may need to generate an output voltage which is larger than the input voltage using the operating voltage VDD at a first input level. The voltage required by devices which operate based on the output voltage of the latch circuit, for example, a memory device, or the like, may maintain a substantially constant value regardless of the miniaturization of the process. For example, regardless of the decrease in the operating voltage VDD of the transistors formed in the logic area, the magnitude of a program voltage or an erase voltage required to write or erase data in the memory device may vary little.

As a result, as the process becomes finer, the difference between the input voltage and the output voltage of the latch circuit may become larger. It is necessary to drive a latch circuit, which receives large power supply voltages, with a low input voltage, such that the latch circuit may not operate stably. In an exemplary embodiment of the present inventive concept, it is possible to control the latch circuit to be easily switched even with a low input voltage by using a current control transistor.

Figure 5:
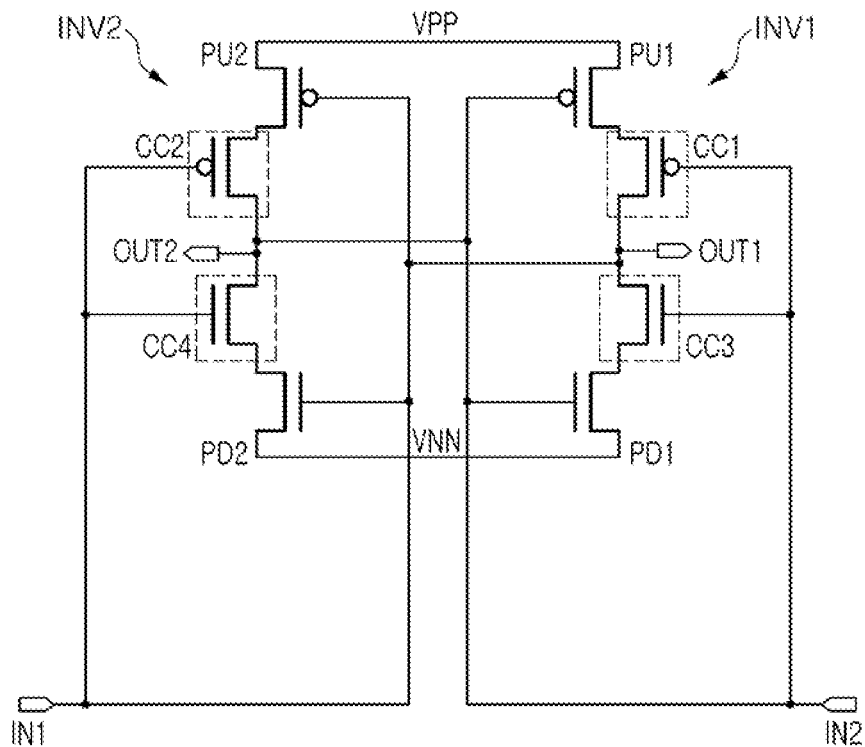
FIG. 5 is a circuit diagram illustrating a latch circuit according to an exemplary embodiment of the present inventive concept.

FIG. 5 is a circuit diagram illustrating a latch circuit according to an exemplary embodiment of the present inventive concept.

Referring to FIG. 5, a latch circuit 100 according to an exemplary embodiment of the present inventive concept may include a first inverter INV1 and a second inverter INV2. The first inverter INV1 and the second inverter INV2 may be connected between a first power supply node through which a first power supply voltage VPP is supplied and a second power supply node through which a second power supply voltage VNN is supplied. The first inverter INV1 may output a first output voltage through a first output node OUT1 and the second inverter INV2 may output a second output voltage through a second output node OUT2. Each of the first output voltage and the second output voltage may be a voltage swinging between the first power supply voltage VPP and the second power supply voltage VNN, and may have a complementary relationship with each other.

The first inverter INV1 may include a first pull-up transistor PU1 and a first pull-down transistor PD1. The first pull-up transistor PU1 may be connected between the first power supply node and the first output node OUT1, and the first pull-down transistor PD1 may be connected between the second power supply node and the first output node OUT1. The first pull-up transistor PU1 and the first pull-down transistor PD1 may be turned on and off by a second input voltage input through a second input node IN2.

The second inverter INV2 may have the same structure as the first inverter INV1. The second inverter INV2 may include a second pull-up transistor PU2 connected between the first power supply node and the second output node OUT2 and a second pull-down transistor PD2 connected between the second power supply node and the second output node OUT2. The second pull-up transistor PU2 and the second pull-down transistor PD2 may be turned on and off by a first input voltage input through a first input node IN1. The first input voltage and the second input voltage may have a complementary relationship with each other.

In addition, the latch circuit 100 may include a plurality of current control transistors CC1, CC2, CC3 and CC4. A first current control transistor CC1 may be connected between the first output node OUT1 and the first pull-up transistor PU1 and a second current control transistor CC2 may be connected between the second output node OUT2 and the second pull-up transistor PU2. In addition, a third current control transistor CC3 may be connected between the first output node OUT1 and the first pull-down transistor PD1 and a fourth current control transistor CC4 may be connected between the second output node OUT2 and the second pull-down transistor PD2. It can be understood that the first inverter INV1 includes a pair of pull-up transistors consisting of the first pull-up transistor PU1 and the first current control transistor CC1 and a pair of pull-down transistors consisting of the first pull-down transistor PD1 and the third current control transistor CC3. It can be also understood that the second inverter INV2 includes a pair of pull-up transistors consisting of the second pull-up transistor PU2 and the second current control transistor CC2 and a pair of pull-down transistors consisting of the second pull-down transistor PD2 and the fourth current control transistor CC4.

The first input voltage and the second input voltage may be voltages swinging between the first input level and the second input level. As described above, the first input level and the second input level may have a complementary relationship with each other, such that when the first pull-up transistor PU1 is turned on at the first inverter INV1 by the first input voltage, the second pull-down transistor PD2 may be turned on at the second inverter INV2 by the second input voltage. Therefore, the first output voltage and the second output voltage may also have a complementary relationship. Hereinafter, an operation of the latch circuit 100 according to the embodiment illustrated in FIG. 5 will be described in more detail together with referring to FIG. 6.

Figure 6:
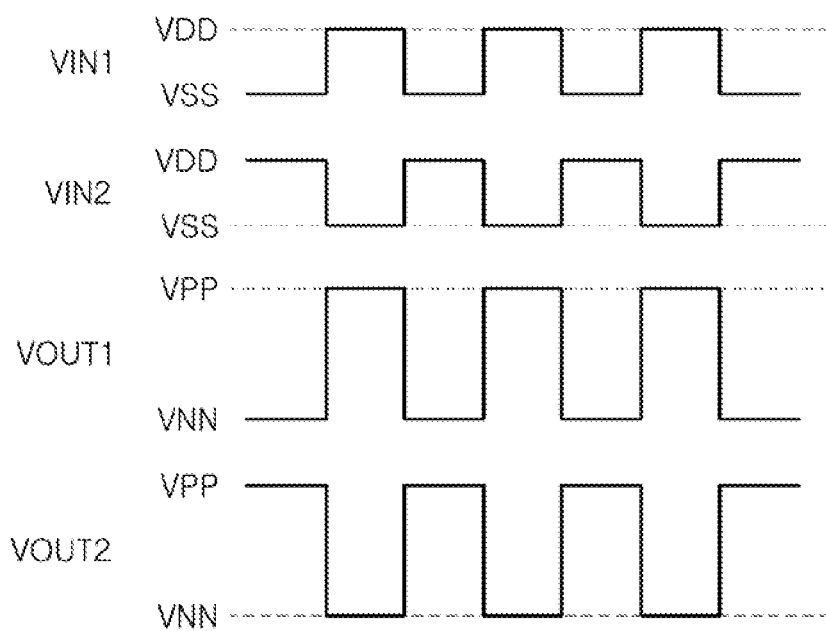
FIG. 6 is a waveform diagram illustrating an operation of a latch circuit according to an exemplary embodiment of the present inventive concept.

FIG. 6 is a waveform diagram illustrating an operation of a latch circuit according to an exemplary embodiment of the present inventive concept. Referring to FIG. 6, the first input voltage VIN1 and the second input voltage VIN2 may have a complementary relationship, and the first output voltage VOUT1 and the second output voltage VOUT2 may also have a complementary relationship. The first input voltage VIN1 and the first output voltage VOUT1 may have the same phase and the second input voltage VIN2 and the second output voltage VOUT2 may have the same phase.

The first input voltage VIN1 and the second input voltage VIN2 may swing between the first input level VDD and the second input level VSS. When the second input voltage VIN2 decreases from the first input level VDD to the second input level VSS, the first pull-down transistor PD1 of the first inverter INV1 may be turned off and the first pull-up transistor PU1 of the first inverter INV1 may be turned on. Therefore, the first output voltage VOUT1 output from the first output node OUT1 may increase from the second power supply voltage VNN to the first power supply voltage VPP.

The first input voltage VIN1 may increase to the first input level VDD when the second input voltage VIN2 decreases to the second input level VSS. When the first input voltage VIN1 increases to the first input level VDD, the second pull-down transistor PD2 of the second inverter INV2 may be turned on and the second pull-up transistor PU2 of the second inverter INV2 may be turned on. Therefore, the second output voltage VOUT2 output from the second output node OUT2 may be reduced from the first power supply voltage VPP to the second power supply voltage VNN.

In an exemplary embodiment of the present inventive concept, the first power supply voltage VPP output by the latch circuit 100 may be a very high voltage compared to the first input level VDD, and the second power supply voltage VNN output by the latch circuit 100 may be a very low voltage compared to the second input level VSS, which may be a negative voltage. Therefore, the first and second pull-up transistors PU1 and PU2 connected to the first power supply voltage VPP with the first and second input voltages VIN1 and VIN2 having the first input level VDD or the second input level VSS of a relatively small size and the first and second pull-down transistors PD1 and PD2 connected to the second power supply voltage VNN may not be smoothly switched.

In an exemplary embodiment of the present inventive concept, the first to fourth current control transistors CC1 to CC4 may be included in the latch circuit 100, such that the first and second pull-up transistors PU1 and PU2 and the first and second pull-down transistors PD1 and PD2 with the first and second input voltages VIN1 and VIN2 having an absolute value lower than the first power supply voltage VPP and the second power supply voltage VNN may be switched. The first to fourth current control transistors CC1 to CC4 may be connected to the first and second pull-up transistors PU1 and PU2 and the first and second pull-down transistors PD1 and PD2 and may reduce or block the current flowing in the first and second pull-up transistors PU1 and PU2 and the first and second pull-down transistors PD1 and PD2 when the first output voltage VOUT1 and the second output voltage VOUT2 increase or decrease. Therefore, the first and second pull-up transistors PU1 and PU2 and the first and second pull-down transistors PD1 and PD2 may be smoothly switched even with the first and second input voltages VIN1 and VIN2 having a small absolute value.

For example, the first current control transistor CC1 may be connected between the first pull-up transistor PU1 and the first output node OUT1. When the second input voltage VIN2 increases from the second input level VSS to the first input level VDD, the first pull-up transistor PU1 and the first current control transistor CC1 may be turned off and the first pull-down transistor PD1 and the third current control transistor CC3 may be turned on.

The first current control transistor CC may not be directly connected to the first power supply voltage VPP unlike the first pull-up transistor PU1, such that it may be more easily turned off than the first pull-up transistor PU1 in response to the second input voltage VIN2. The current path between the first output node OUT1 and the first pull-up transistor PU1 may be weakened or blocked by turning-off the first current control transistor CC. Therefore, the first output voltage VOUT1 output through the first output node OUT1 may be switched more smoothly from the first power supply voltage VPP to the second power supply voltage VNN. The operation and the effect of the second current control transistor CC2 may be similar to those of the first current control transistor CC1.

The fourth current control transistor CC4 may be connected between the second pull-down transistor PD2 and the second output node OUT2. When the first input voltage VIN1 decreases from the first input level VDD to the second input level VSS, the second pull-up transistor PU2 and the second current control transistor CC2 may be turned on and the second pull-down transistor PD2 and the fourth current control transistor CC4 may be turned off.

The fourth current control transistor CC4 may not be directly connected to the second power supply voltage VNN, such that it may be turned off more easily than the second pull-down transistor PD2 in response to the first input voltage VIN1. The current path between the second output node OUT12 and the second pull-down transistor PD2 may be weakened or blocked as the fourth current control transistor CC4 is turned off and the second output voltage VOUT2 output through the second output node OUT2 may be smoothly switched to the first power supply voltage VPP. The operation and the effect of the third current control transistor CC3 may be similar to those of the fourth current control transistor CC4.

Figure 7:
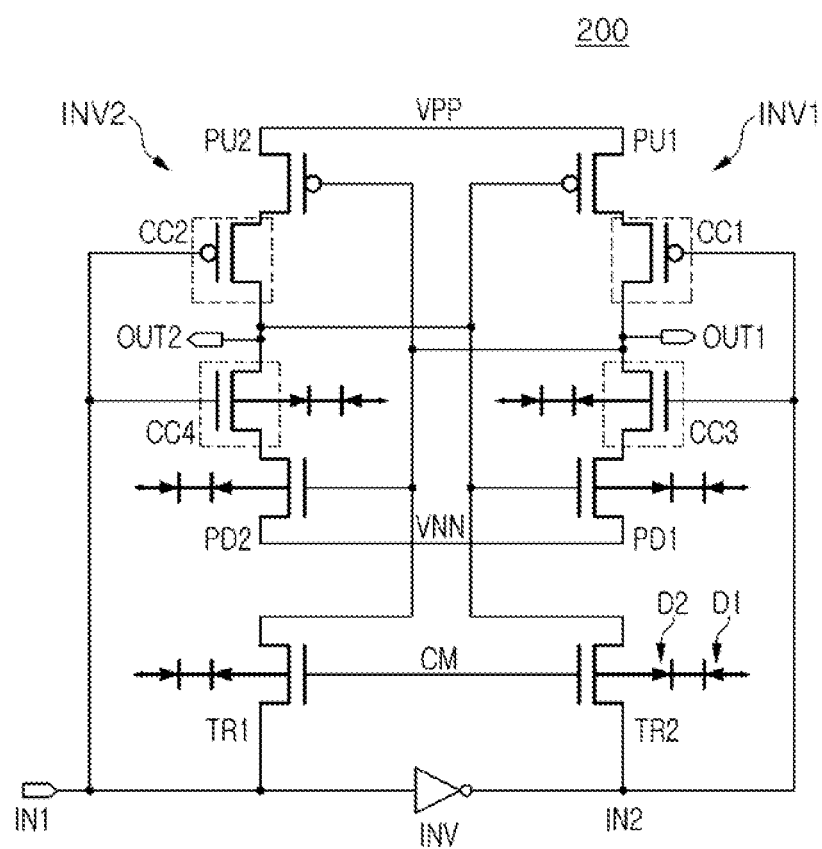
FIG. 7 is a circuit diagram illustrating a latch circuit according to an exemplary embodiment of the present inventive concept.

FIG. 7 is a circuit diagram illustrating a latch circuit according to an exemplary embodiment of the present inventive concept.

Referring to FIG. 7, a latch circuit 200 according to an exemplary embodiment of the present inventive concept may include a first inverter INV1 and a second inverter INV2. The first inverter INV1 may output a first output voltage VOUT1 through a first output node OUT1, and the second inverter INV2 may output a second output voltage VOUT2 through a second output node OUT2. Each of the first output voltage VOUT1 and the second output voltage VOUT2 may be voltages swinging between the first power supply voltage VPP and the second power supply voltage VNN, and may have a complementary relationship with each other.

The first inverter INV1 may include a first pull-up transistor PU1, a first pull-down transistor PD1, a first current control transistor CC1, and a third current control transistor CC3. The second inverter INV2 may include a second pull-up transistor PU2, a second pull-down transistor PD2, a second current control transistor CC2, and a fourth current control transistor CC4. The transistors included in each of the first inverter INV1 and the second inverter INV2 may be turned on or off by a first input voltage VIN1 and a second input voltage VIN2 having a complementary relationship with each other. The first input voltage VIN1 and the second input voltage VIN2 may be input through the first input node IN1 and the second input node IN2, respectively.

In the embodiment illustrated in FIG. 7, the operation of the latch circuit 200 may be similar to the operation of the latch circuit 100 described above with reference to FIGS. 5 and 6. For example, the second input voltage VIN2 input to the second input node IN2 decreases from the first input level VDD to the second input level VSS, the first pull-down transistor PD1 and the third current control transistor CC3 may be turned off and the first pull-up transistor PU1 and the first current control transistor CC1 may be turned on. The third current control transistor CC3 may be easily turned off compared to the first pull-down transistor PD1 since it does not directly receive the second power supply voltage VNN. Therefore, the current path between the first pull-down transistor PD1 and the first output node OUT1 may be weakened or blocked by the third current control transistor CC3 and the first output voltage VOUT1 may be smoothly switched to the first power supply voltage VPP.

Referring to FIG. 7, the latch circuit 200 may further include a first transistor TR1 for inputting the first input voltage VIN1 to the second inverter INV2 and a second transistor TR2 for inputting the second input voltage VIN2 to the first inverter INV1. The first transistor TR1 and the second transistor TR2 may receive the first input voltage VIN1 and the second input voltage VIN2 through a source terminal, respectively. For example, an inverter INV may be connected between a source terminal of the first transistor TR1 and a source terminal of the second transistor TR2. A phase of the first input voltage VIN1 may be inverted by the inverter INV to generate the second input voltage VIN2 and the second input voltage VIN2 may be input to the source terminal of the second transistor TR2.

The first transistor TR1 and the second transistor TR2 may be turned on and off by a common control voltage CM. The common control voltage CM may turn-on the first transistor TR1 and the second transistor TR2 while the first input voltage VIN1 and the second input voltage VIN2 transition. For example, while the first input voltage VIN1 and the second input voltage VIN2 transition, the common control voltage CM may be maintained at a voltage similar in magnitude to the first input level VDD.

When the transition time of the first input voltage VIN1 and the second input voltage VIN2 elapses, the common control voltage CM may decrease to the second power supply voltage VNN. Since the first transistor TR1 is connected to the first output node OUT1 and the second transistor TR2 is connected to the second output node OUT12, the common control voltage CM may also be reduced to the second power supply voltage VNN such that the second output voltage VOUT2 may be reduced to the second power supply voltage VNN.

In addition, in the embodiment illustrated in FIG. 7, at least a portion of the transistors included in the latch circuit 200 may have a triple-well structure. For example, the first and second pull-down transistors PD1 and PD2, the third and fourth current control transistors CC3 and CC4, the first transistor TR1, and the second transistor TR2 may have a triple-well structure.

By including the triple-well structure in those n-channel metal oxide semiconductor (NMOS) transistors, a plurality of diodes D1 and D2 may be formed between a channel of the NMOS transistors and a semiconductor substrate. The plurality of diodes D1 and D2 may be formed such that cathodes are connected to each other. Accordingly, current leakage from the NMOS transistors to the semiconductor substrate may be significantly reduced, and the high voltage characteristics of the NMOS transistors may be improved. This will be described in more detail with reference to FIGS. 8 and 9.

Figure 8:
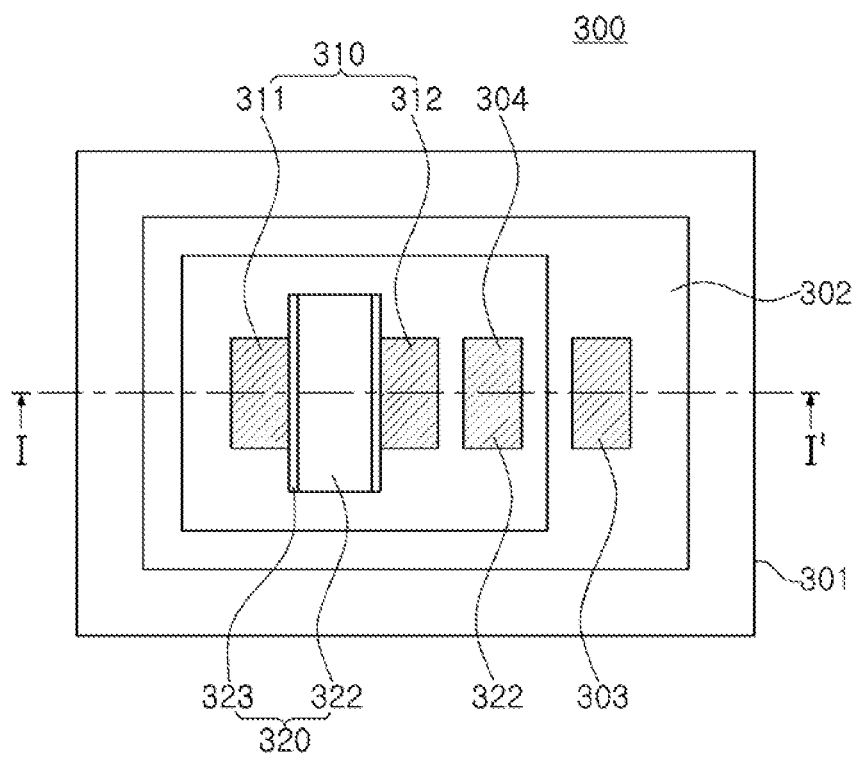
FIGS. 8 and 9 are diagrams illustrating transistors included in a latch circuit according to an exemplary embodiment of the present inventive concept.
Figure 9:
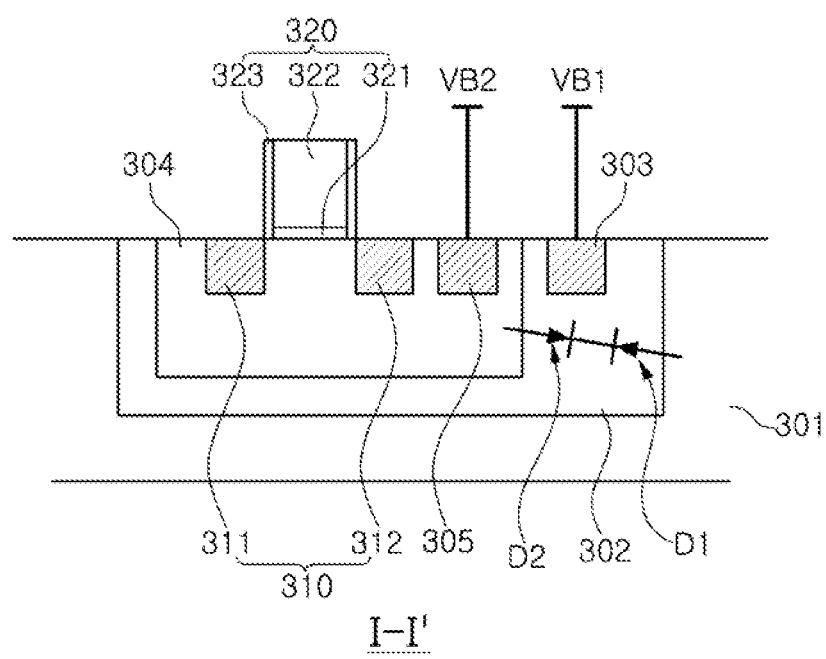

FIGS. 8 and 9 are diagrams illustrating a transistor included in a latch circuit according to an exemplary embodiment of the present inventive concept. A transistor illustrated in FIGS. 8 and 9 may be an NMOS transistor 300 having a triple-well structure.

Referring to FIGS. 8 and 9, the NMOS transistor 300 included in a latch circuit according to an exemplary embodiment of the present inventive concept may include an active area 310 and a gate structure 320. The active area 310 may include a source area 311 and a drain area 312 disposed on both sides of the gate structure 320. The gate structure 320 may include a gate insulating layer 321, a gate electrode 322, gate spacer 323, and the like. For example, the gate electrode 322 may include a plurality of layers formed of different conductive materials.

A first impurity area 302 may be formed in a semiconductor substrate 301 and a second impurity area 304 may be formed in the first impurity area 302. The semiconductor substrate 301 may include a P-type impurity, and the first impurity area 302 may include an N-type impurity. The second impurity area 304 may include a P-type impurity similar to the semiconductor substrate 301. The source area 311 and the drain area 312 formed in the second impurity area 304 may be doped with N-type impurities. As illustrated in FIGS. 8 and 9, the first impurity area 302 may surround the second impurity area 304. For example, the first impurity area 302 may be formed as a deep N-well structure. The first impurity area 302 may be a Pocket P-well.

Bias areas 303 and 305 may be formed in each of the first impurity area 302 and the second impurity area 304. A first bias voltage VB1 may be input to a first bias area 303 and a second bias voltage VB2 may be input to a second bias area 305 of the second impurity area 304. In an exemplary embodiment of the present inventive concept, the first bias area 303 may include an N-type impurity at a higher concentration than the first impurity area 302, and the second bias area 305 may include a P-type impurity at a higher concentration than the second impurity area 304.

The first bias voltage VB1 may be a positive voltage and the second bias voltage VB2 may be a low voltage of a voltage input to each of the source area 311 and the drain area 312. For example, the second bias voltage VB2 may be a second power supply voltage VNN, which is a negative voltage. The first bias voltage VB1 may be a first input level VDD or a first power supply voltage VPP. Therefore, a first diode D1 provided by the semiconductor substrate 301 and the first impurity area 302 and a second diode D2 provided by the first impurity area 302 and the second impurity area 304 may be biased in a reverse direction, and the high voltage characteristics of the NMOS transistor 300 may be improved.

Figure 10:
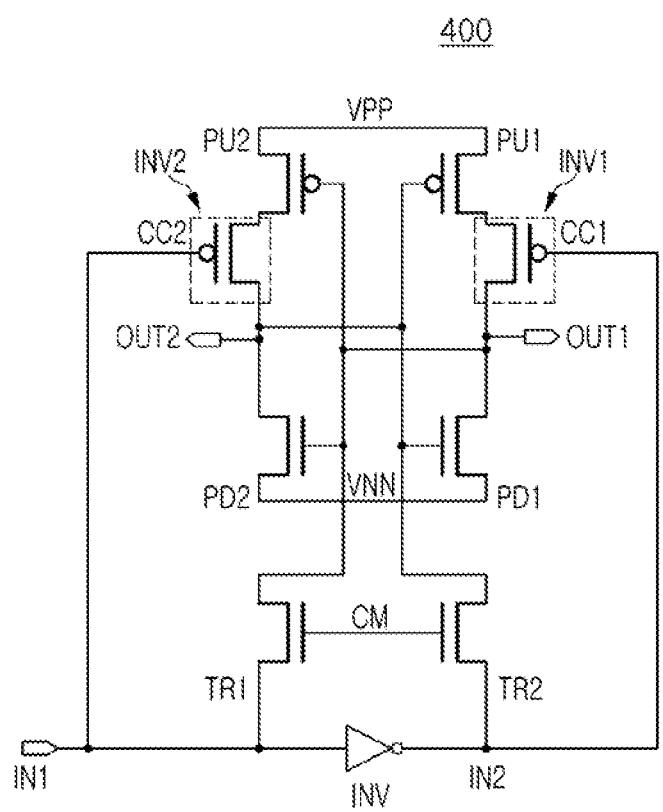
FIGS. 10 and 11 circuit diagrams illustrating latch circuits according to an exemplary embodiment of the present inventive concept.
Figure 11:
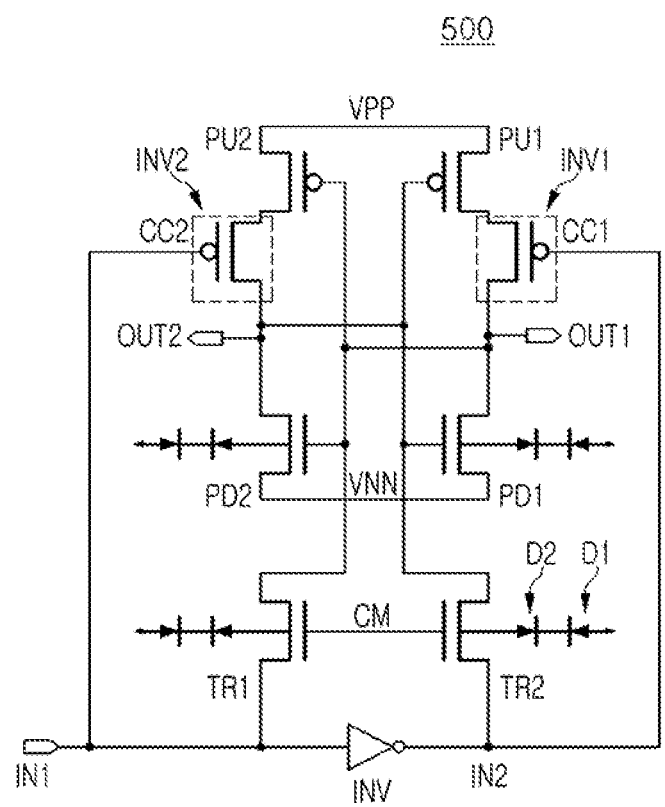

FIGS. 10 and 11 are circuit diagrams illustrating latch circuits according to exemplary embodiments of the present inventive concept.

Referring first to FIG. 10, a latch circuit 400 according to the present embodiment may include a first inverter INV1 and a second inverter INV2. The first inverter INV1 may output a first output voltage VOUT1 through a first output node OUT1, and the second inverter INV2 may output a second output voltage VOUT2 through a second output node OUT2. The first output voltage VOUT1 and the second output voltage VOUT2 may swing between the first power supply voltage VPP and the second power supply voltage VNN. The first input voltage VIN1 and the second input voltage VIN2 may swing between a first input level VDD and a second input level VSS, wherein the second input level VSS is lower than the first input level VDD.

The latch circuit 400 may include a first current control transistor CC1 connected between a first pull-up transistor PU1 and the first output node OUT1 in the first inverter INV1 and a second current control transistor CC2 connected between a second pull-up transistor PU2 and the second output node OUT2 in the second inverter INV2. Like the first pull-up transistor PU1 and a first pull-down transistor PD1 included in the first inverter INV1, the first current control transistor CC1 may be turned on or off by a second input voltage VIN2 input through a second input node IN2. Similarly, like the second pull-up transistor PU2 and a second pull-down transistor PD2 included in the second inverter INV2, the second current control transistor CC2 may be turned on and off by a first input voltage VIN1 input through a first input node IN1.

When the first input voltage VIN1 increases to the first input level VDD and the second input voltage VIN2 decreases to the second input level VSS, the first output voltage VOUT1 may increase from the second power supply voltage VNN to the first power supply voltage VPP and the second output voltage VOUT2 may increase from the first power supply voltage VPP to the second power supply voltage VNN. In this case, the second current control transistor CC2 may be turned off together with the second pull-up transistor PU2 by the first input voltage VIN1. When the second current control transistor CC2 is turned off, the current path between the second pull-up transistor PU2 and the second output node OUT2 may be blocked or weakened. Therefore, the second output voltage VOUT2 may smoothly transition from the first power supply voltage VPP to the second power supply voltage VNN. Conversely, when the first input voltage VIN1 decreases to the second input level VSS and the second input voltage VIN2 increases to the first input level VDD, the first current control transistor CC1 may be turned off such that the first output voltage VOUT1 may smoothly transition from the first power supply voltage VPP to the second power supply voltage VNN.

The first input voltage VIN1 may be input to the second inverter INV2 through a first transistor TR1 and the second input voltage VIN2 may be input to the first inverter INV1 through a second transistor TR2. The first transistor TR1 and the second transistor TR2 may be controlled by a common control voltage CM and may maintain in the turned on state during the transition of the first and second input voltages VIN1 and VIN2. When the transition time of the first and second input voltages VIN1 and VIN2 has elapsed, the common control voltage CM may be reduced to the second power supply voltage VNN.

Next, referring to FIG. 11, the NMOS transistors included in latch circuit 500 may have a triple-well structure. The triple-well structure may be similar to that described with reference to FIGS. 8 and 9. The leakage current of the NMOS transistors may be reduced by the triple-well structure, while the high voltage characteristics may be improved. Other components included in the latch circuit 500 may be similar to those described above with reference to FIG. 10. It is to be further understood that like reference numerals may refer to like elements in all of the drawings.

Figure 12:
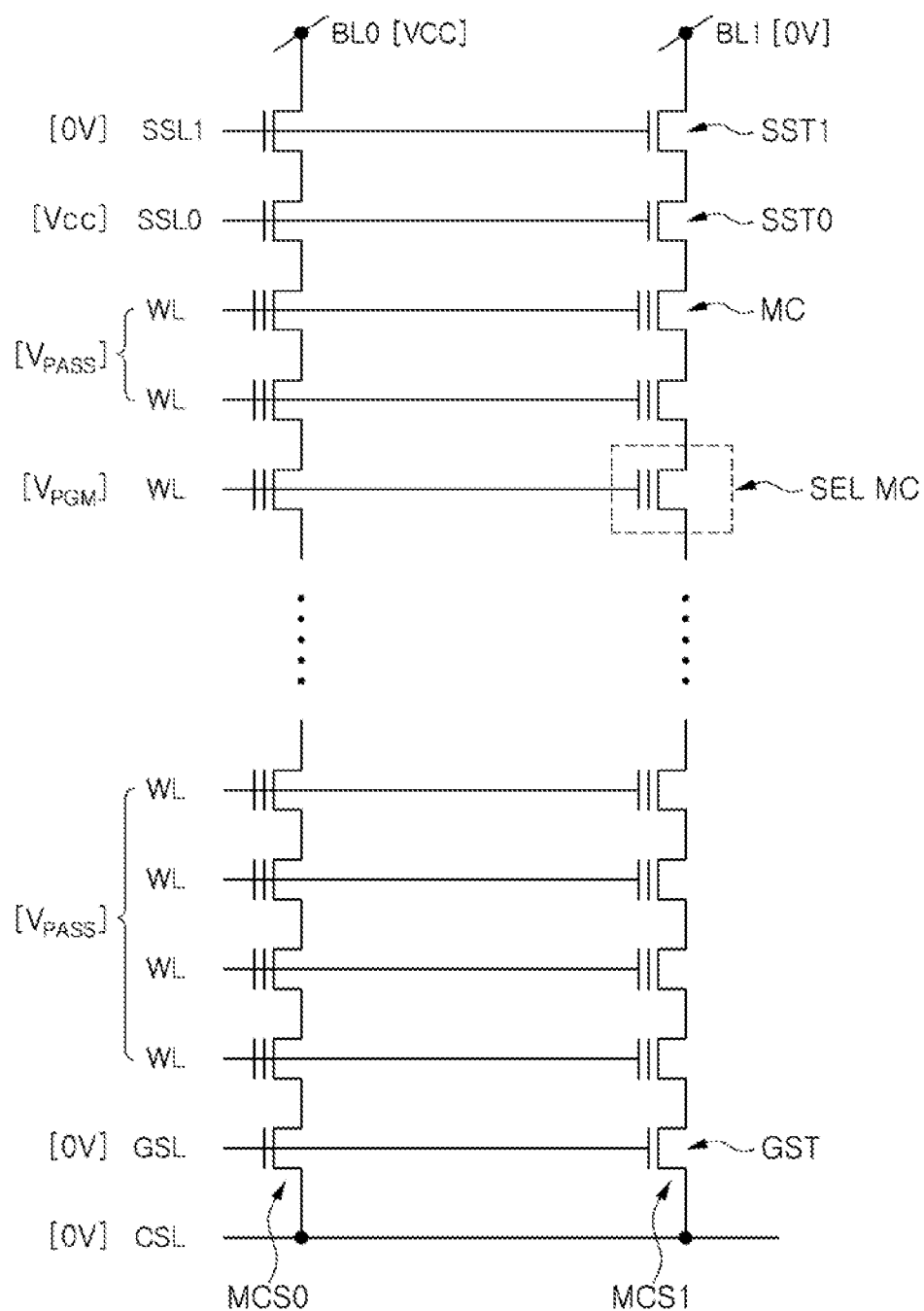
FIGS. 12 and 13 are diagrams illustrating an operation of a memory device including a latch circuit according to an exemplary embodiment of the present inventive concept.
Figure 13:
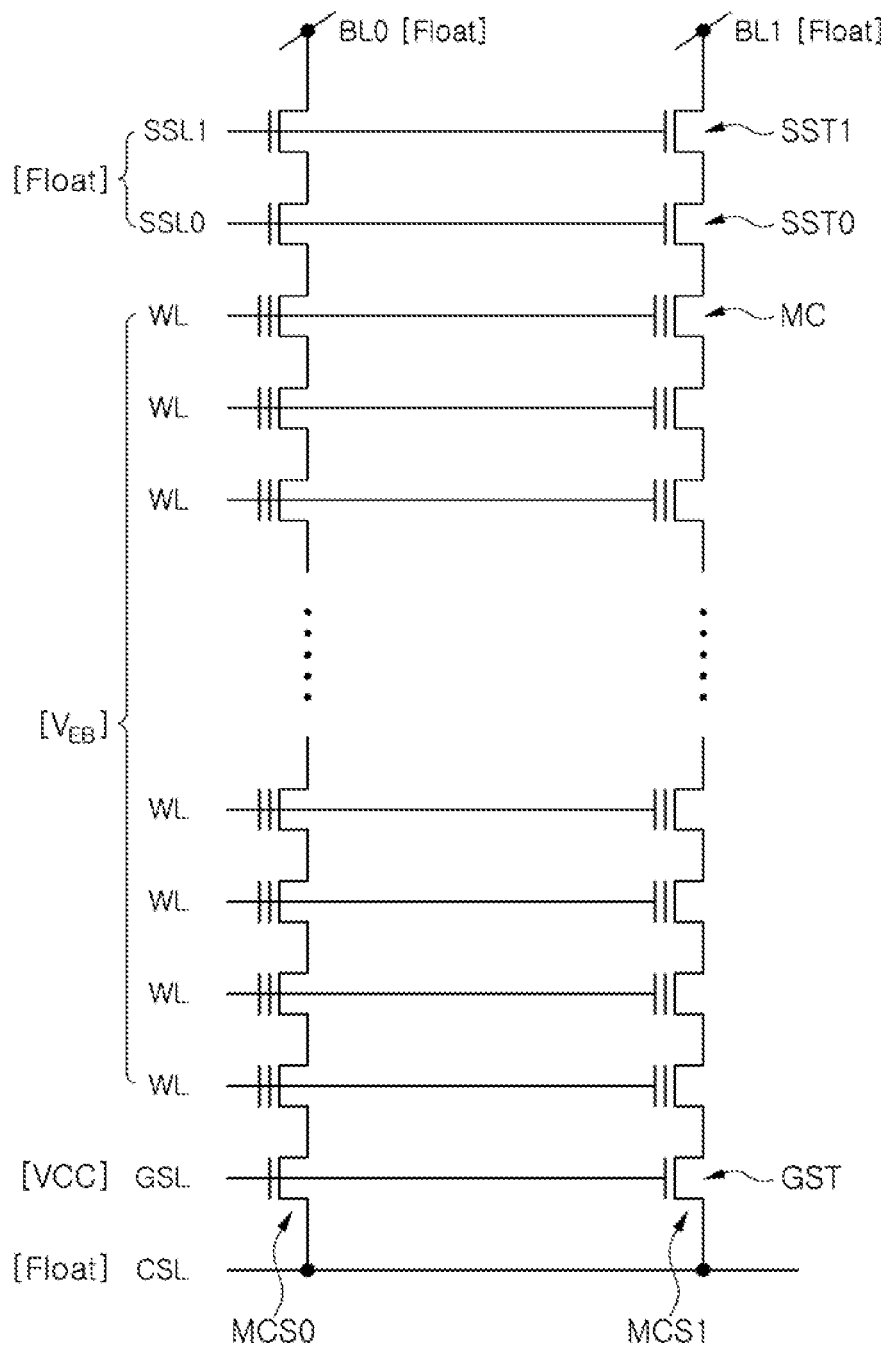

FIGS. 12 and 13 are diagrams illustrating an operation of a memory device including a latch circuit according to an exemplary embodiment of the present inventive concept.

FIG. 12 is a diagram illustrating a program operation of a memory device, and FIG. 13 is a diagram illustrating an erasing operation of a memory device. In the exemplary embodiments of the present inventive concept illustrated in FIGS. 12 and 13, the memory device may be a non-volatile memory device.

Referring to FIGS. 12 and 13, the memory device may include a plurality of memory cell strings MCS0 and MCS1. Each of the memory cell strings MCS0 and MCS1 may include a plurality of memory cells MCs connected to each other in series, string selection transistors SST0 and SST1 connected between the plurality of memory cells MCs and bit lines BL0 and BL1, a ground selection transistor GST connected between the plurality of memory cells MCs and a common source line CSL, and the like. The embodiments illustrated in FIGS. 12 and 13 illustrate that each of the memory cell strings MCS0 and MCS1 includes a ground selection transistor GST and two string selection transistors SST0 and SST1, but the present inventive concept is not limited thereto. For example, more than two or less than two string selection transistors may be included in a memory cell string and more than one ground selection transistor may be included in a memory cell string.

The plurality of memory cells MC may be connected to a plurality of word lines WL and the string selection transistors SST0 and SST1 may be connected to string selection lines SSL0 and SSL1 and the ground selection transistor GST may be connected to a ground selection line GSL. An appropriate bias voltage may be input in each of the word lines WL, the string selection lines SSL0 and SSL1, the ground selection line GSL, the common source line CSL and the bit lines BL0 and BL1 according to operations performed in the memory device.

Referring to FIG. 12, program bias voltages may be input in each of the word lines WL, string selection lines SSL0 and SSL1, ground selection line GSL, common source line CSL, and bit lines BL0 and BL1 to record data in a selected memory cell SEL MC. For example, a voltage of 0V may be input to a selected bit line BL1 connected to the selected memory cell string MCS1 including the selected memory cell SEL MC and a predetermined power supply voltage VCC may be input to an unselected bit line BL0.

The selected memory cell string MCS1 and the unselected memory cell string MCS0 may share the word lines WL, the string selection lines SSL0 and SSL1, and the common source line CSL. A voltage of 0V may be input to the common source line CSL and the ground selection line GSL and a power supply voltage VCC and a voltage of 0V may be input to each of the string selection lines SSL0 and SSL1 for channel boosting. In addition, a program voltage $V_{PGM}$ may be input to the word line WL connected to the selected memory cell SEL MC and a pass voltage $V_{PASS}$ may be input to the remaining word lines WL. The program voltage $V_{PGM}$ may be a voltage higher than the pass voltage $V_{PASS}$.

Next, referring to FIG. 13 for explaining an erasing operation, the bit lines BL0 and BL1, the common source line CSL and the string selection lines SSL0 and SSL1 may be floated. In addition, a power supply voltage VCC may be input to the ground selection line GSL and an erase bias voltage $V_{EB}$ may be input to the word lines WL. As illustrated in FIG. 13, it is possible to erase the data written in the memory cells MC by inputting the erase bias voltages $V_{EB}$ as illustrated in FIG. 13, and inputting an erase voltage having a negative voltage to the substrate on which the memory device is formed.

The power supply voltage necessary for driving a logic circuit of the memory device may gradually decrease as the process of the elements formed in the logic circuit becomes finer. On the other hand, the program voltage $V_{PGM}$ necessary for the programming operation of the memory device, the erase voltage input to the substrate in the erasing operation, or the like may be relatively large in order to store a charge in a charge storage layer of the selected memory cell SEL MC. As described above, the latch circuit according to exemplary embodiments of the present inventive concept may drive relatively high output voltages smoothly by driving inverters connected to a high power supply voltage with a low input voltage using a current control transistor. Therefore, the present inventive concept may be applied to the memory device including the logic circuit operating with a very small power supply voltage. For example, the latch circuit according to exemplary embodiments of the present inventive concept may be included in a decoder circuit that inputs a bias voltage necessary for the operation of the memory device.

Figure 14:
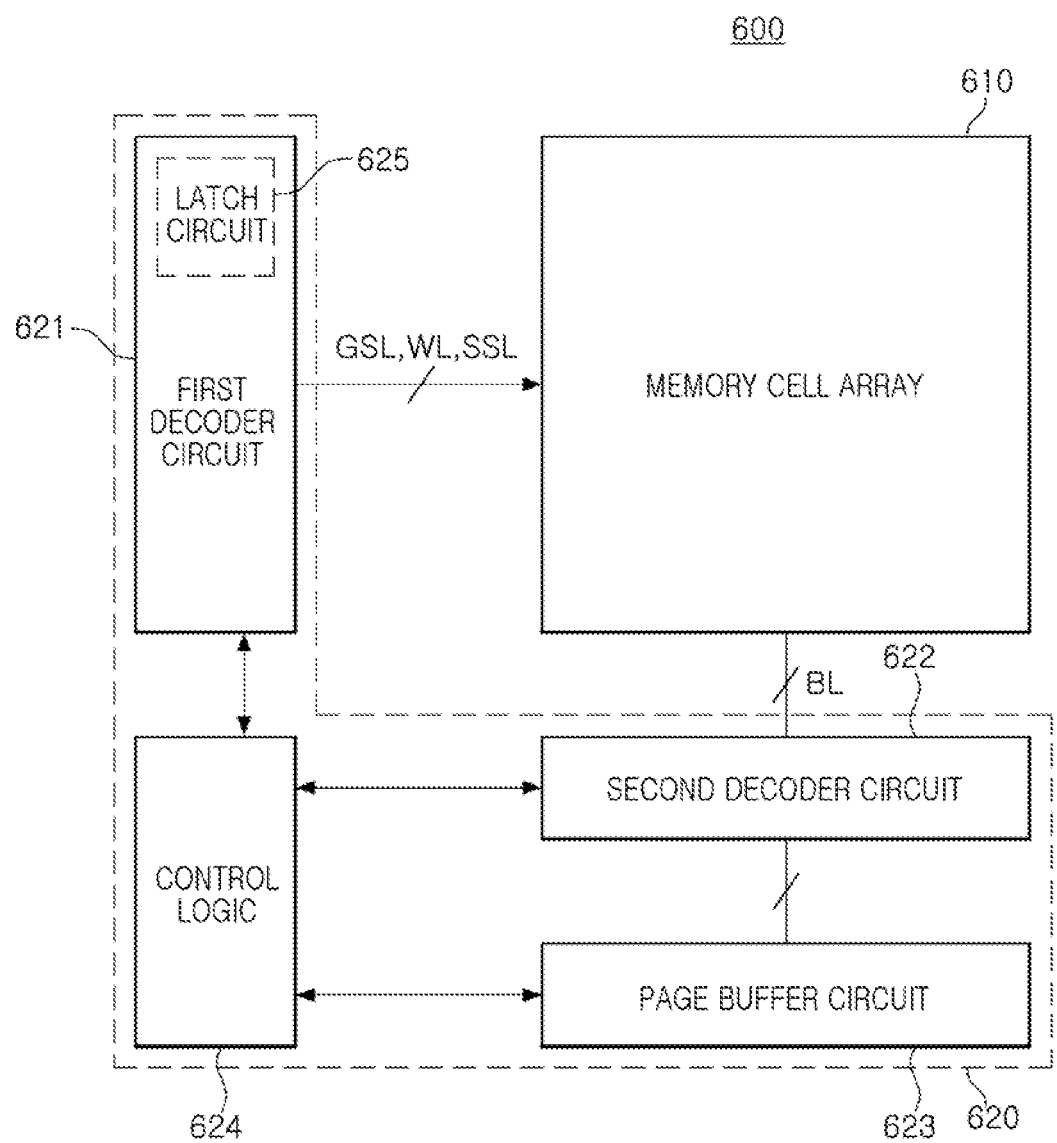
FIG. 14 is a diagram illustrating an operation of an internet of things (IoT) including a latch circuit according to an exemplary embodiment of the present inventive concept.

FIG. 14 is a block diagram illustrating a memory device including a latch circuit according to an exemplary embodiment of the present inventive concept.

Referring to FIG. 14, a memory device 600 according to an exemplary embodiment of the present inventive concept may include a memory cell array 610 and a memory controller 620. The memory cell array 610 may include a plurality of memory cells and at least a portion of the plurality of memory cells may be connected to form a memory cell string. The memory cell array 610 may include a plurality of memory cell strings, and the plurality of memory cell strings may be divided into a plurality of blocks. The memory controller 620 may include a first decoder circuit 621, a second decoder circuit 622, a page buffer circuit 623, a control logic 624, and the like.

In an exemplary embodiment of the present inventive concept, the first decoder circuit 621 may be connected to the plurality of memory cells included in the memory cell array 610 through word lines WL, string selection lines SSL, ground selection lines GSL, and the like. The page buffer circuit 623 may be connected to the memory cells through the second decoder circuit 622 and bit lines BL. In an exemplary embodiment of the present inventive concept, the page buffer circuit 623 may record data to the memory cells, may read data from the memory cells, or may record or read data on a page-by-page basis. The operations of the first decoder circuit 621, the second decoder circuit 622 and the page buffer circuit 623 may be controlled by the control logic 624.

A process of forming elements included in the control logic 624 is becoming increasingly miniaturized and thus the power supply voltages necessary for driving the control logic 624 are gradually decreasing. On the other hand, the first decoder circuit 621 may generate bias voltages necessary to perform a programming operation, a reading operation, an erasing operation, and the like, for the memory cell array 610, and at least a portion of the bias voltages may be very large relative to the power supply voltages of the control logic 624. In an exemplary embodiment of the present inventive concept, a latch circuit 625 included in the first decoder circuit 621 may generate at least a portion of the bias voltages.

The structure, operation, and the like, of the latch circuit 625 may be understood with reference to the embodiments described above with reference to FIGS. 1 to 11. For example, the latch circuit 625 may be one of the latch circuits described above with reference to FIGS. 1 to 11. The latch circuit 625 may include an inverter for outputting an output voltage higher than the power supply voltage of the control logic 624, a current control transistor for ensuring smooth switching of the pull-up and pull-down transistors included in the inverter, and the like. The current control transistor may be coupled between the output node and the pull-up transistor and/or between the output node and the pull-down transistor in the latch circuit 625. The current control transistor may be turned on or off when the input voltage of the latch circuit 625 transitions, such that the current path between the output node and the pull-up transistor may be blocked or weakened. Therefore, even when a difference between the input voltage and the output voltage of the latch circuit 625 is large, the transition operation of the pull-up and the pull-down transistors included in the latch circuit 625 may be performed smoothly.

Figure 15:
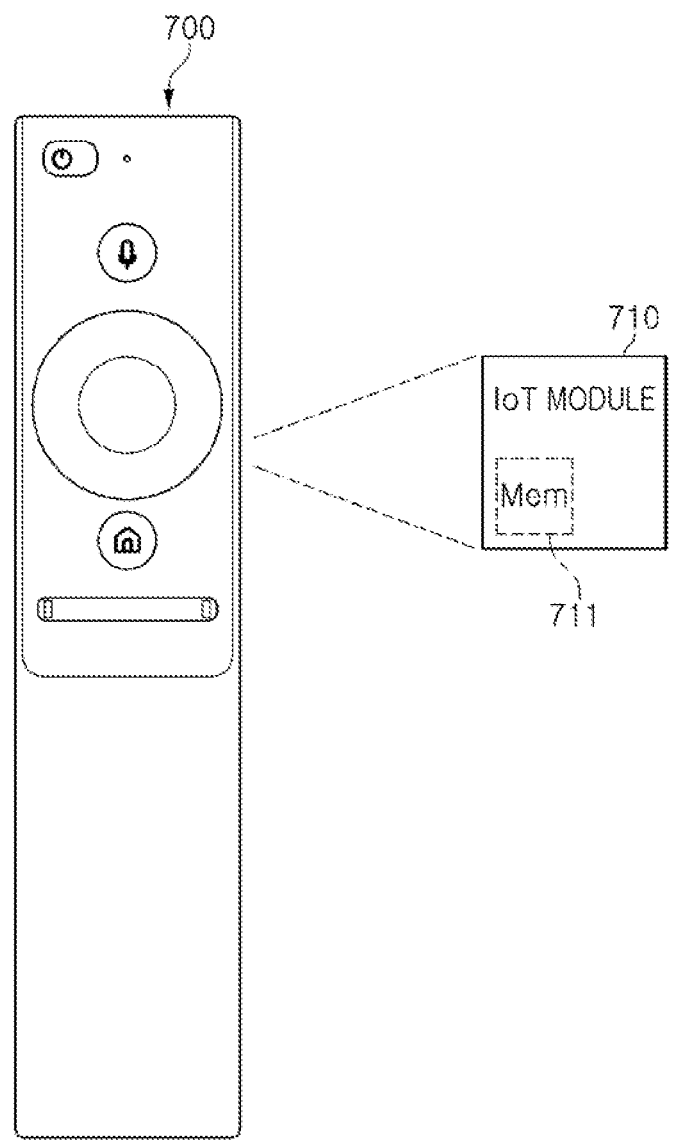
FIG. 15 is a block diagram including a latch circuit according to an exemplary embodiment of the present inventive concept.

FIG. 15 is a diagram illustrating an operation of an electronic device including a latch circuit according to an exemplary embodiment of the present inventive concept.

Referring to FIG. 15, a latch circuit according to an exemplary embodiment of the present inventive concept may be employed in a memory device 711. The memory device 711 may be provided in a package with an internet of things (IoT) module 710, and the IoT module 710 may be mounted in an electronic device 700 operated by a battery. For example, the electronic device 700 may be a portable device such as a remote controller operated by a battery.

Generally, when a power supply of the electronic device 700 depends on the battery, the voltage of the power supplied by the battery may decrease, according to the duration of the battery. For example, the voltage supplied by a general-purpose battery may be about 1.5V at the time of initial use, but it may be reduced to about 1V after a period of use. Therefore, the latch circuit included in the memory device 711 may need to generate an output voltage necessary for operation of the memory device 711 with a low input voltage.

As described above, the latch circuits according to the exemplary embodiments of the present inventive concept may transition their pull-up and pull-down transistors to a low input voltage using their current control transistors. Therefore, the memory device 711 may be stably operated in a portable device in which a stable and constant power is not supplied.

As set forth above, a current control transistor may be connected between an output node for outputting an output voltage and a pull-up transistor and/or between an output node for outputting an output voltage and a pull-down transistor. The current control transistor can then control a current flowing in the pull-up transistor and/or the pull-down transistor such that the pull-up transistor and/or the pull-down transistor may be easily switched. Therefore, a latch circuit capable of easily reducing flowing into the pull-up transistor and/or the pull-down transistor by the current control transistor when the output voltage is changed, and thereby generating an output voltage with a low input voltage may be implemented.

While the present inventive concept has been shown and described with reference to exemplary embodiments thereof, it will be apparent to those skilled in the art that modifications and variations could be made thereto without departing from the scope of the present inventive concept as defined by the appended claims.

What is claimed is:

1. A latch circuit, comprising:
a first inverter having a first pull-up transistor connected between a first power supply node for supplying a first power supply voltage and a first output node, and a first pull-down transistor connected between a second power supply node for supplying a second power supply voltage and the first output node, wherein the second power supply voltage is lower than the first power supply voltage;
a second inverter having a second pull-up transistor connected between the first power supply node and a second output node, and a second pull-down transistor connected between the second power supply node and the second output node;
a first current control transistor connected between the first pull-up transistor and the first output node;
a second current control transistor connected between the second pull-up transistor and the second output node;
a third current control transistor connected between the first pull-down transistor and the first output node; and
a fourth current control transistor connected between the second pull-down transistor and the second output node,
wherein the first inverter, the second inverter, and the first, second, third and fourth current control transistors are controlled by a first input voltage or a second input voltage, wherein the second input voltage has a complementary relationship with the first input voltage.

2. The latch circuit of claim 1, wherein the second pull-up transistor, the second pull-down transistor, the second current control transistor and the fourth current control transistor are controlled by the first input voltage.

3. The latch circuit of claim 1, wherein the first pull-up transistor, the first pull-down transistor, the first current control transistor and the third current control transistor are controlled by the second input voltage.

4. The latch circuit of claim 1, wherein each of the first input voltage and the second input voltage swings between a first input level and a second input level, wherein the second input level is lower than the first input level.

5. The latch circuit of claim 4, wherein the first power supply voltage is higher than the first input level and the second power supply voltage is lower than the second input level.

6. The latch circuit of claim 4, wherein when the first input voltage increases from the second input level to the first input level, the third current control transistor is turned off, and the second current control transistor is turned off.

7. The latch circuit of claim 4, wherein when the first input voltage decreases from the first input level to the second input level, the first current control transistor is turned off, and the fourth current control transistor is turned off.

8. The latch circuit of claim 1, further comprising a first transistor receiving the first input voltage; and
a second transistor receiving the second input voltage.

9. The latch circuit of claim 8, wherein each of the first transistor and the second transistor has a triple-well structure.

10. The latch circuit of claim 8, wherein the first transistor and the second transistor are controlled by a common control voltage, and the common control voltage maintains the first transistor and the second transistor in a turned on state while the first input voltage and the second input voltage change.

11. The latch circuit of claim 1, wherein the first pull-up transistor, the second pull-up transistor, the first current control transistor, and the second current control transistor are p-channel metal oxide semiconductor (PMOS) transistors, and
the first pull-down transistor, the second pull-down transistor, the third current control transistor, and the fourth current control transistor are n-channel metal oxide semiconductor (NMOS) transistors.

12. The latch circuit of claim 1, wherein each of the first pull-down transistor, the second pull-down transistor, the third current control transistor, and the fourth current control transistor comprises a first impurity area formed in a semiconductor substrate, a second impurity area formed in the first impurity area, and active areas formed in the second impurity area.

13. The latch circuit of claim 12, wherein the first impurity area and the active areas comprise an impurity of a first conductivity type, and the second impurity area comprises an impurity of a second conductivity type different from the first conductivity type.

14. The latch circuit of claim 12, wherein the first impurity area comprises a first bias area for receiving the first power supply voltage, wherein the first bias area is doped with impurities of the same conductivity type as impurities of the active areas, and
the second impurity area comprises a second bias area for receiving the second power supply voltage, wherein the second bias area is doped with impurities of a conductivity type different from the impurities of the active areas.

15. A latch circuit, comprising:
a first transistor for transferring a first input voltage;
a second transistor for transferring a second input voltage having a phase opposite to the first input voltage;
a first inverter for outputting a first output voltage having the same phase as the first input voltage in response to the second input voltage, and having a pair of pull-up transistors connected to each other in series and a first pull-down transistor, wherein a first pull-up transistor of the pair of pull-up transistors has its gate connected to a first terminal of the second transistor and a second pull-up transistor of the pair of pull-up transistors has its gate connected to a second terminal of the second transistor; and a second inverter for outputting a second output voltage having the same phase as the second input voltage in response to the first input voltage, and having a pair of pull-up transistors connected to each other in series and a second pull-down transistor.

16. The latch circuit of claim 15, wherein the first transistor, the second transistor, the first pull-down transistor included in the first inverter, and the second pull-down transistor included in the second inverter have a triple-well structure.

17. The latch circuit of claim 15, wherein the first inverter comprises a third pull-down transistor connected in series with the first pull-down transistor.

18. The latch circuit of claim 15, further comprising: an inverter connected between the second terminal of the second transistor and a second terminal of the first transistor.

19. A latch circuit, comprising:
a first inverter for outputting a first output voltage having the same phase as a first input voltage in response to a second input voltage having a phase opposite to the first input voltage, and including a pair of pull-up transistors connected to each other in series and a pair of pull-down transistors connected to each other in series, wherein a first pull-up transistor of the pair of pull-up transistors has its gate connected to a first terminal of a second transistor and a second pull-up transistor of the pair of pull-up transistors has its gate connected to a second terminal of the second transistor; and a second inverter for outputting a second output voltage having the same phase as the second input voltage in response to the first input voltage, and including a pair of pull-up transistors connected to each other in series and a pair of pull-down transistors connected to each other in series, wherein the pull-down transistors included in each of the first inverter and the second inverter have a triple-well structure.

20. The latch circuit of claim 19, further comprising: a first transistor for transferring the first input voltage to the second inverter and the second transistor for transferring the second input voltage to the first inverter, and the first transistor and the second transistor have a triple-well structure.

* * * * *